US010055675B2

(12) United States Patent
Micks et al.

(10) Patent No.: US 10,055,675 B2
(45) Date of Patent: *Aug. 21, 2018

(54) TRAINING ALGORITHM FOR COLLISION AVOIDANCE USING AUDITORY DATA

(71) Applicant: Ford Global Technologies, LLC, Dearborn, MI (US)

(72) Inventors: Ashley Elizabeth Micks, Mountain View, CA (US); Jinesh J Jain, Palo Alto, CA (US); Kyu Jeong Han, Palo Alto, CA (US); Harpreetsingh Banvait, Sunnyvale, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 94 days.

This patent is subject to a terminal disclaimer.

(21) Appl. No.: 15/183,610

(22) Filed: Jun. 15, 2016

(65) Prior Publication Data

US 2017/0364776 A1   Dec. 21, 2017

(51) Int. Cl.
*G06K 9/62* (2006.01)
*G06K 9/66* (2006.01)
(Continued)

(52) U.S. Cl.
CPC ............ *G06K 9/66* (2013.01); *G01S 13/006* (2013.01); *G01S 13/865* (2013.01);
(Continued)

(58) Field of Classification Search
None
See application file for complete search history.

(56) References Cited

U.S. PATENT DOCUMENTS 6,236,908 B1 * 5/2001 Cheng ............... F02D 41/0062
701/1
7,739,096 B2   6/2010 Wegerich
(Continued)

FOREIGN PATENT DOCUMENTS

JP   2014067092 A   4/2014

OTHER PUBLICATIONS

Timothy A. Zimmerman, Neural Network Based Obstacle Avoidance Using Simulated Sensor Data, ASEE 2014 Zone I Conference, Apr. 3-5, 2014, University of Bridgeport, Bridgpeort, CT, USA.*
(Continued)

*Primary Examiner* — Andrae S Allison
(74) *Attorney, Agent, or Firm* — David R. Stevens; Stevens Law Group

(57) ABSTRACT

A machine learning model is trained by defining a scenario including models of vehicles and a typical driving environment. A model of a subject vehicle is added to the scenario and sensor locations are defined on the subject vehicle. A perception of the scenario by sensors at the sensor locations is simulated. The scenario further includes a model of a parked vehicle with its engine running. The location of the parked vehicle and the simulated outputs of the sensors perceiving the scenario are input to a machine learning algorithm that trains a model to detect the location of the parked vehicle based on the sensor outputs. A vehicle controller then incorporates the machine learning model and estimates the presence and/or location of a parked vehicle with its engine running based on actual sensor outputs input to the machine learning model.

20 Claims, 8 Drawing Sheets

(51) Int. Cl.
*G01S 13/00* (2006.01)
*G01S 13/86* (2006.01)
*G01S 13/93* (2006.01)
*G01S 17/00* (2006.01)
*G01S 17/93* (2006.01)
*G06F 17/50* (2006.01)
*G06N 99/00* (2010.01)
*G06K 9/00* (2006.01)
*G05D 1/00* (2006.01)
*G09B 9/54* (2006.01)

(52) U.S. Cl.
CPC .......... *G01S 13/931* (2013.01); *G01S 17/006* (2013.01); *G01S 17/936* (2013.01); *G05D 1/0088* (2013.01); *G06F 17/5009* (2013.01); *G06K 9/00825* (2013.01); *G06N 99/005* (2013.01); *G09B 9/54* (2013.01)

(56) References Cited

U.S. PATENT DOCUMENTS

| | | | | |
|---|---|---|---|---|
| 8,976,040 B2* | 3/2015 | Ray Avalani | ........ | B60Q 9/008 340/435 |
| 8,996,248 B2* | 3/2015 | Kim | ........ | G07C 5/008 340/539.19 |
| 9,740,944 B2* | 8/2017 | Micks | ........ | G06K 9/00805 |
| 2005/0196035 A1* | 9/2005 | Luo | ........ | G06K 9/00369 382/159 |
| 2011/0156928 A1* | 6/2011 | Ghisio | ........ | B62D 15/028 340/932.2 |
| 2014/0180539 A1* | 6/2014 | Kim | ........ | G07C 5/008 701/36 |
| 2014/0347196 A1* | 11/2014 | Schulz | ........ | G08G 1/096716 340/932.2 |
| 2015/0112504 A1* | 4/2015 | Binion | ........ | G07C 5/008 701/1 |

OTHER PUBLICATIONS

Castaño, Fernando, et al. "Obstacle Recognition Based on Machine Learning for On-Chip LiDAR Sensors in a Cyber-Physical System." Sensors 17.9 (2017): 2109.*

George et al, Exploring Sound Signature for Vehicle Detection and Classification Using Ann, International Journal on Soft Computing (IJSC) vol. 4, No. 2, May 2013.*

Cakir, et al. "Convolutional recurrent neural networks for polyphonic sound event detection." arXiv preprint arXiv:1702.06286 (2017).*

* cited by examiner

TRAINING ALGORITHM FOR COLLISION AVOIDANCE USING AUDITORY DATA

BACKGROUND

Field of the Invention

This invention relates to performing obstacle avoidance in autonomous vehicles.

Background of the Invention

Autonomous vehicles are equipped with sensors that detect their environment. An algorithm evaluates the output of the sensors and identifies obstacles. A navigation system may then steer the vehicle, brake, and/or accelerate to both avoid the identified obstacles and reach a desired destination. Sensors may include both imaging systems, e.g. video cameras, as well as RADAR or LIDAR sensors.

The systems and methods disclosed herein provide an improved approach for detecting obstacles.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
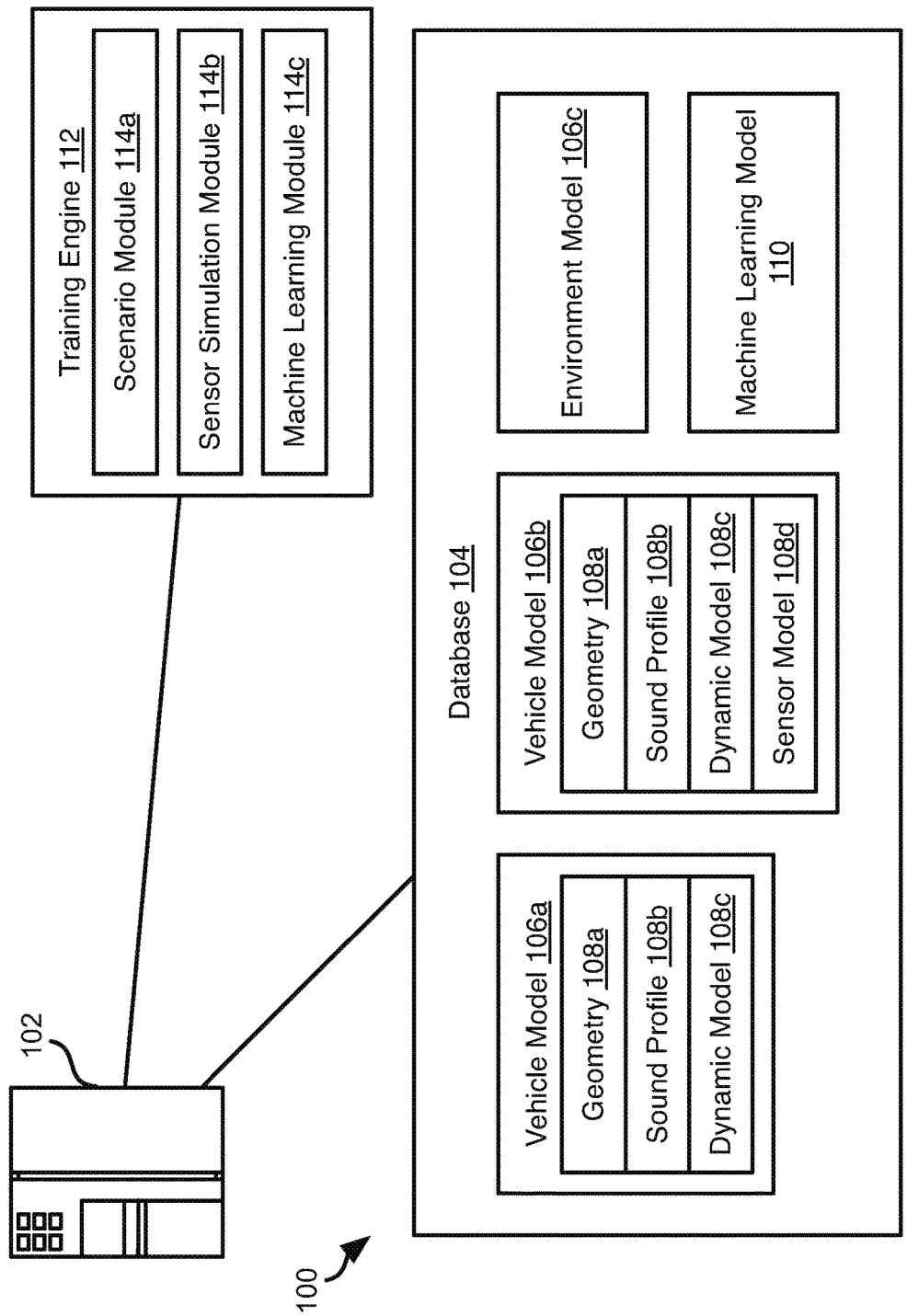
FIG. 1 is a schematic block diagrams of a system for implementing a training algorithm in accordance with an embodiment of the present invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Referring to FIG. 1, a network environment 100 may include a server system 102 may host or access a database 104 including data sufficient to define a scenario for training of a detection system. In particular, the database 104 may store vehicle models 106a that include the geometry data 108a of the vehicle, e.g. the shape of the body, tires, and any other visible features of the vehicle. The geometry data 108a may further include material data, such as hardness or material type. The vehicle model 106a may further include a sound profile 108b that includes audio files or other data characteristic of sound produced by the vehicle under certain circumstances, e.g. idling, engine starting, commencement of movement after stopping, moving at different speeds, and moving at different levels of accelerations at different speeds. The vehicle model 106a may further include a dynamic model 108c that indicates operation limits of the vehicle, e.g. turning radius, acceleration profile (e.g., maximum acceleration from a standing start), and the like. The vehicle models 106a may be based on actual vehicles and the fields 108a-108c may be populated using data obtained from measuring the actual vehicles.

In some embodiments, the database 104 may store a vehicle model 106b for a vehicle incorporating one or more sensors that are used for obstacle detection. As described below, the outputs of these sensors may be input to a model that is trained using the models of the database 104. Accordingly, the vehicle model 106b may additionally include a sensor model 108d that indicates the locations of the sensors on the vehicle, the orientations of the sensors, and one or more descriptors of the sensors. For example, for a microphone, the sensor model 108d may include the gain, signal to noise ratio, sensitivity profile (sensitivity vs. frequency), and the like. For a camera, the sensor model 108d may include the field of view, resolution, zoom, frame rate, or other operational limit of the camera. For a LIDAR or RADAR sensor, the sensor model 108d may include a resolution, field of view, and scan rate of the system.

The database 104 may include an environment model 106c that includes models of various landscapes, such models of parking lots, parking garages, city streets with intersections, buildings, pedestrians, trees etc. The models may define the geometry and location of objects in a landscape and may further include other aspects such as reflectivity to laser, RADAR, sound, light, etc. in order to enable simulation of perception of the objects by a sensor.

The database 104 may store a machine learning model 110. The machine learning model 110 may be trained using the models 106a-106c according to the methods described herein. The machine learning model 110 may be a deep neural network, Bayesian network, or other type of machine learning model.

The server system 102 may execute a training engine 112. The training engine 112 may include a scenario module 114a. The scenario module 114a may retrieve models 106a-106c and generate a scenario of models of vehicles parked in various relationships to one another in various parking situations (parking lot, parking garage, parked on a street) the scenario may further define models of one or more vehicles moving around parked vehicles or moving into or out of a parked position. The scenario module 114a may generate these scenarios manually or receive human inputs specifying initial locations of vehicles, velocities of vehicles, etc. In some embodiments, scenarios may be modeled based on video or other measurements of an actual location, e.g. observations of an area, the location of parked vehicles in the area, movements of vehicles in the area, the location of other objects in the area, etc.

The training engine 112 may include a sensor simulation module 114b. In particular, for a scenario, and a vehicle included in the scenario including sensor model data 108d, a perception of the scenario by the sensors may be simulated by the sensor simulation module 114b as described in greater detail below.

The training engine 112 may include a machine learning module 114c. The machine learning module 114c may train the machine learning model 110. For example, the machine learning model 110 may be trained to identify a parked vehicle with its engine running and its location (in some embodiments) by inputting the simulated sensor outputs as well as the location of the model of the parked vehicle with its engine running in the scenario and its classification as an parked car with its engine running. In particular, the sensor outputs may be provided as an input data set and the classification of the parked vehicle as having its vehicle running may be provided as the desired output for the input data set. In some embodiments, the relative location of the parked vehicle with its engine running may also be provided as the desired output for the input data set.

Figure 2:
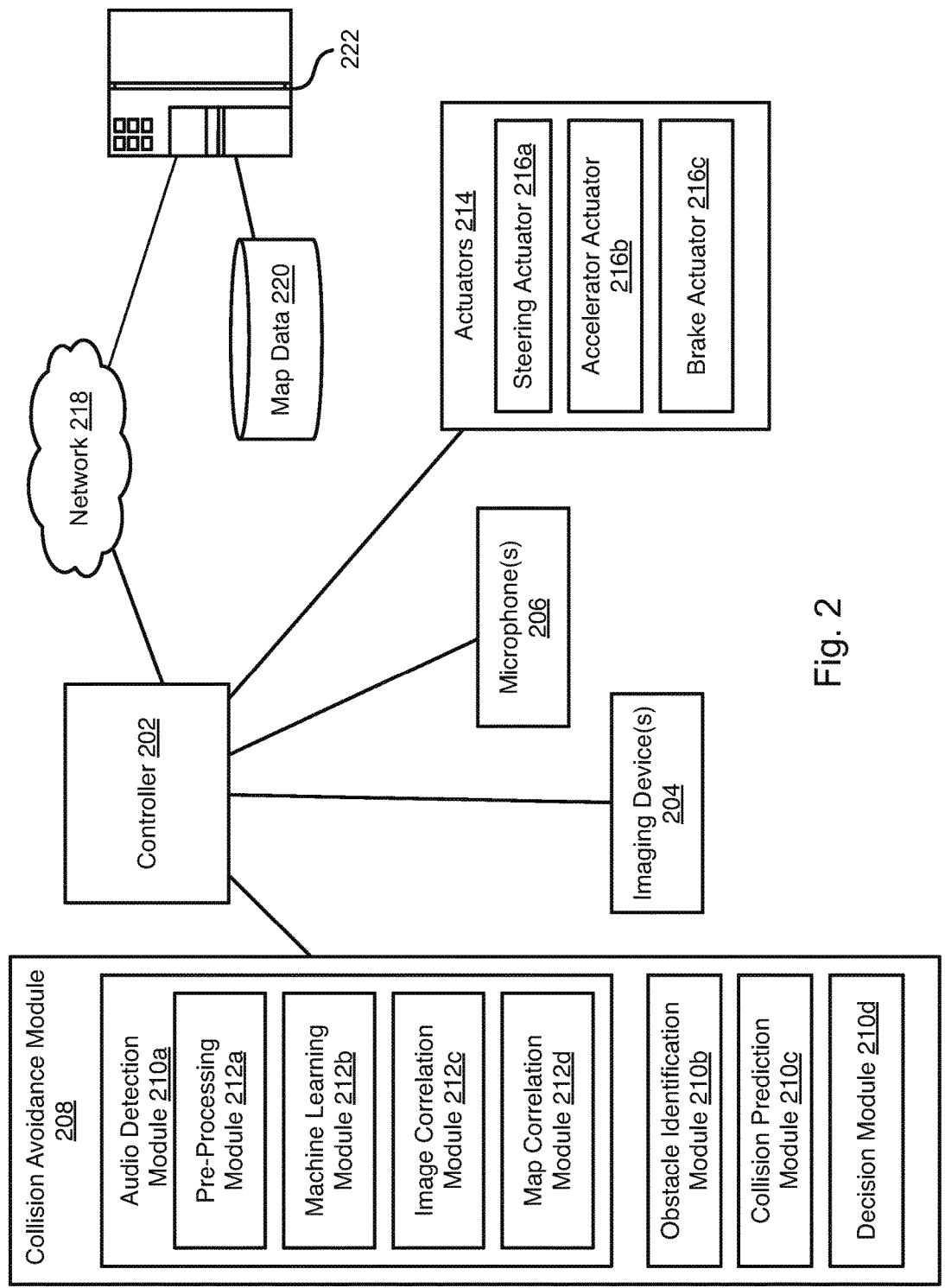
FIG. 2 is a schematic block diagram including a vehicle incorporating a model trained in accordance with an embodiment of the present invention.

Referring to FIG. 2, a controller 202 may be housed within a vehicle. The vehicle may include any vehicle known in the art. The vehicle may have all of the structures and features of any vehicle known in the art including, wheels, a drive train coupled to the wheels, an engine coupled to the drive train, a steering system, a braking system, and other systems known in the art to be included in a vehicle.

As discussed in greater detail herein, the controller 202 may perform autonomous navigation and collision avoidance. In particular, image data and audio data may be analyzed to identify obstacles. In particular, audio data may be used to identify vehicles that are not in the field of view of one or more cameras or other imaging sensors, as described in detail below with respect to FIGS. 6 and 7.

The controller 202 may receive one or more image streams from one or more imaging devices 204. For example, one or more cameras may be mounted to the vehicle and output image streams received by the controller 202. The controller 202 may receive one or more audio streams from one or more microphones 206. For example, one or more microphones or microphone arrays may be mounted to the vehicle and output audio streams received by the controller 202. The microphones 206 may include directional microphones having a sensitivity that varies with angle.

The controller 202 may execute a collision avoidance module 208 that receives the image streams and audio streams and identifies possible obstacles and takes measures to avoid them. Other imaging devices 204 may be used to detect obstacles such as RADAR (Radio Detection and Ranging), LIDAR (Light Detection and Ranging), SONAR (Sound Navigation and Ranging), and the like. Accordingly, the "image streams" received by the controller 202 may include one or both of optical images detected by a camera and objects and topology sensed using one or more other sensing devices. The controller 202 may then analyze both images and sensed objects and topology in order to identify potential obstacles The collision avoidance module 208 may include an audio detection module 210a. The audio detection module 210a may include an audio pre-processing module 212a that is programmed to process the one or more audio streams in order to identify features that could correspond to a vehicle. The audio detection module 210a may further include a machine learning module 212b that implements a model that evaluates features in processed audio streams from the pre-processing module 212a and attempts to classify the audio features. The machine learning module 212b may output a confidence score indicating a likelihood that a classification is correct. The function of the modules 212a, 212b of the audio detection module 210a is described in greater detail below with respect to the method 700 of FIG. 7.

The audio detection module 210a may further include an image correlation module 212c that is programmed to evaluate image outputs from the one or more imaging devices 204 and attempt to identify a vehicle in the image data within an angular tolerance from an estimated direction to the source of a sound corresponding to a vehicle, such as a parked vehicle that is running but is not moving. If a vehicle is indicated within the angular tolerance, then a confidence that the sound corresponds to a vehicle is increased.

The audio detection module 210a may further include a map correlation module 212d. The map correlation module 212d evaluates map data to determine whether a parking stall, driveway, or other parking area is located within the angular tolerance from the direction to the source of a sound corresponding to a vehicle with its engine running, particularly a parked vehicle. If so, then the confidence that the sound corresponds to a parked vehicle with its engine running is increased.

The collision avoidance module 208 may further include an obstacle identification module 210b, a collision prediction module 210c, and a decision module 210d. The obstacle identification module 210b analyzes the one or more image streams and identifies potential obstacles, including people, animals, vehicles, buildings, curbs, and other objects and structures. In particular, the obstacle identification module 210b may identify vehicle images in the image stream.

The collision prediction module 210c predicts which obstacle images are likely to collide with the vehicle based on its current trajectory or current intended path. The collision prediction module 210c may evaluate the likelihood of collision with objects identified by the obstacle identification module 210b as well as obstacles detected using the audio detection module 210a. In particular, vehicles having their engines running identified with an above-threshold confidence by the audio detection module 210a may be added to a set of potential obstacles, particularly the potential movements of such vehicles. The decision module 210d may make a decision to stop, accelerate, turn, etc. in order to avoid obstacles. The manner in which the collision prediction module 210c predicts potential collisions and the manner in which the decision module 210d takes action to avoid potential collisions may be according to any method or system known in the art of autonomous vehicles.

The decision module 210d may control the trajectory of the vehicle by actuating one or more actuators 214 controlling the direction and speed of the vehicle. For example, the actuators 214 may include a steering actuator 216a, an accelerator actuator 216b, and a brake actuator 216c. The configuration of the actuators 216a-216c may be according to any implementation of such actuators known in the art of autonomous vehicles.

The controller 202 may be network-enabled and retrieve information over a network 218. For example, map data 220 may be accessed from a server system 222 in order to identify potential parking spaces near the autonomous vehicle housing the controller 202.

Figure 3:
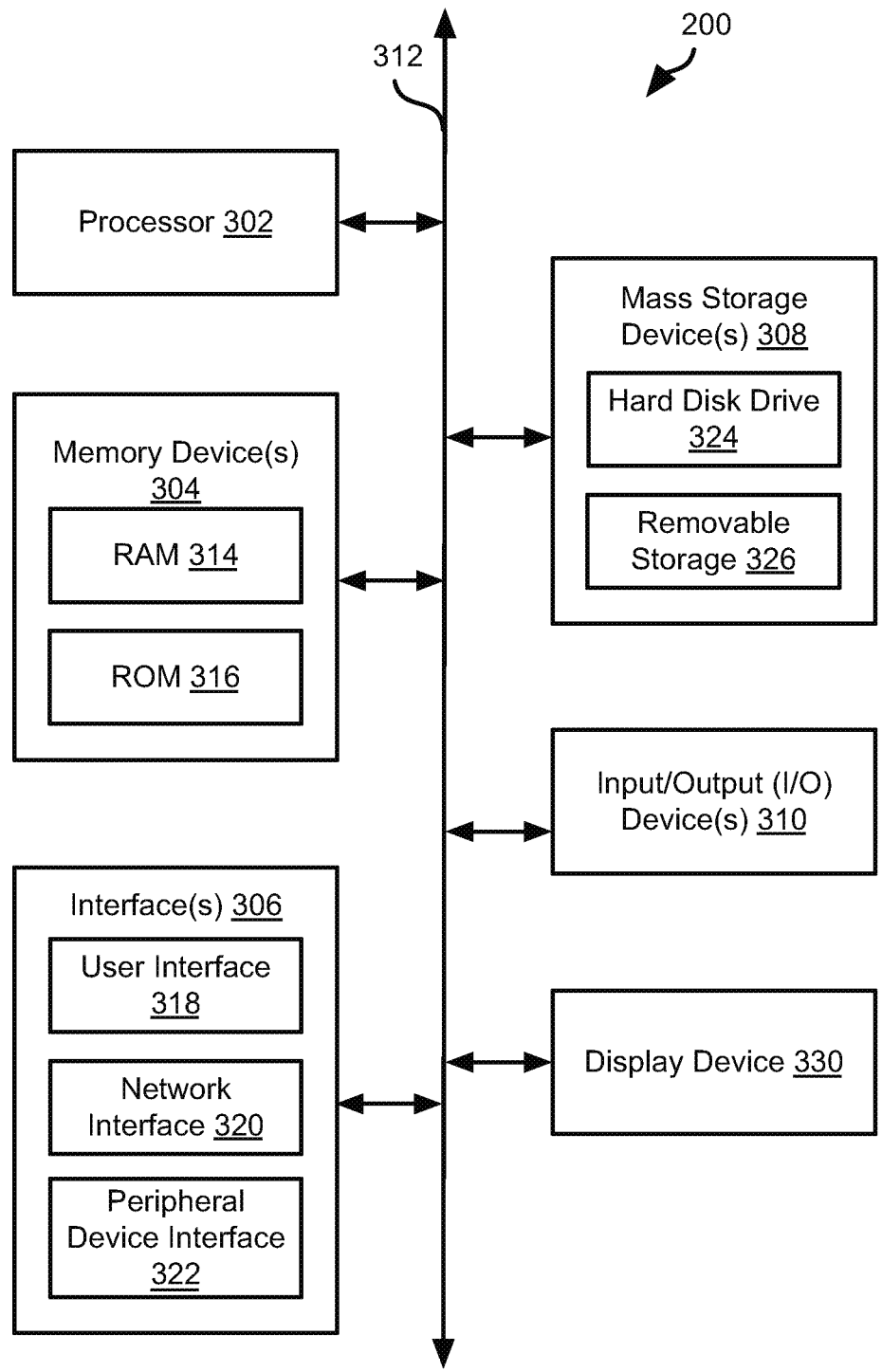
FIG. 3 is a schematic block diagram of an example computing device suitable for implementing methods in accordance with embodiments of the invention.

FIG. 3 is a block diagram illustrating an example computing device 300. Computing device 300 may be used to perform various procedures, such as those discussed herein. The server system 102 and controller 202 may have some or all of the attributes of the computing device 300.

Computing device 300 includes one or more processor(s) 302, one or more memory device(s) 304, one or more interface(s) 306, one or more mass storage device(s) 308, one or more Input/Output (I/O) device(s) 310, and a display device 330 all of which are coupled to a bus 312. Processor(s) 302 include one or more processors or controllers that execute instructions stored in memory device(s) 304 and/or mass storage device(s) 308. Processor(s) 302 may also include various types of computer-readable media, such as cache memory.

Memory device(s) 304 include various computer-readable media, such as volatile memory (e.g., random access memory (RAM) 314) and/or nonvolatile memory (e.g., read-only memory (ROM) 316). Memory device(s) 304 may also include rewritable ROM, such as Flash memory.

Mass storage device(s) 308 include various computer readable media, such as magnetic tapes, magnetic disks, optical disks, solid-state memory (e.g., Flash memory), and so forth. As shown in FIG. 3, a particular mass storage device is a hard disk drive 324. Various drives may also be included in mass storage device(s) 308 to enable reading from and/or writing to the various computer readable media. Mass storage device(s) 308 include removable media 326 and/or non-removable media.

I/O device(s) 310 include various devices that allow data and/or other information to be input to or retrieved from computing device 300. Example I/O device(s) 310 include cursor control devices, keyboards, keypads, microphones, monitors or other display devices, speakers, printers, network interface cards, modems, lenses, CCDs or other image capture devices, and the like.

Display device 330 includes any type of device capable of displaying information to one or more users of computing device 300. Examples of display device 330 include a monitor, display terminal, video projection device, and the like.

Interface(s) 306 include various interfaces that allow computing device 300 to interact with other systems, devices, or computing environments. Example interface(s) 306 include any number of different network interfaces 320, such as interfaces to local area networks (LANs), wide area networks (WANs), wireless networks, and the Internet. Other interface(s) include user interface 318 and peripheral device interface 322. The interface(s) 306 may also include one or more peripheral interfaces such as interfaces for printers, pointing devices (mice, track pad, etc.), keyboards, and the like.

Bus 312 allows processor(s) 302, memory device(s) 304, interface(s) 306, mass storage device(s) 308, I/O device(s) 310, and display device 330 to communicate with one another, as well as other devices or components coupled to bus 312. Bus 312 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 300, and are executed by processor(s) 302. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 4:
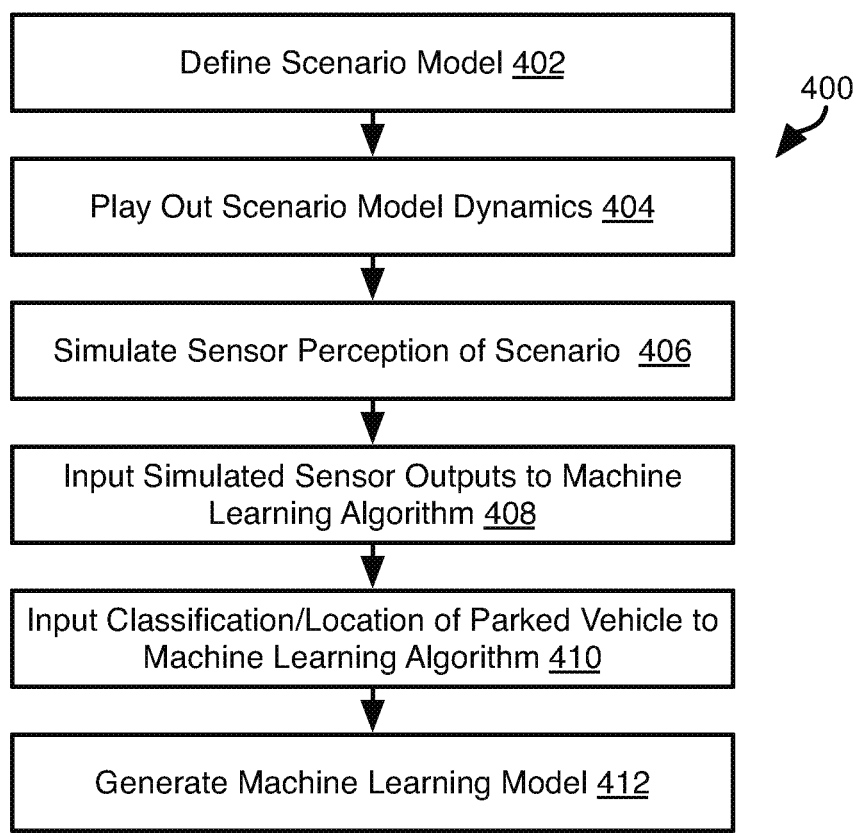
FIG. 4 is a process flow diagram of a method for training a model to detect vehicles with engines running in accordance with an embodiment of the present invention.
Figure 5A:
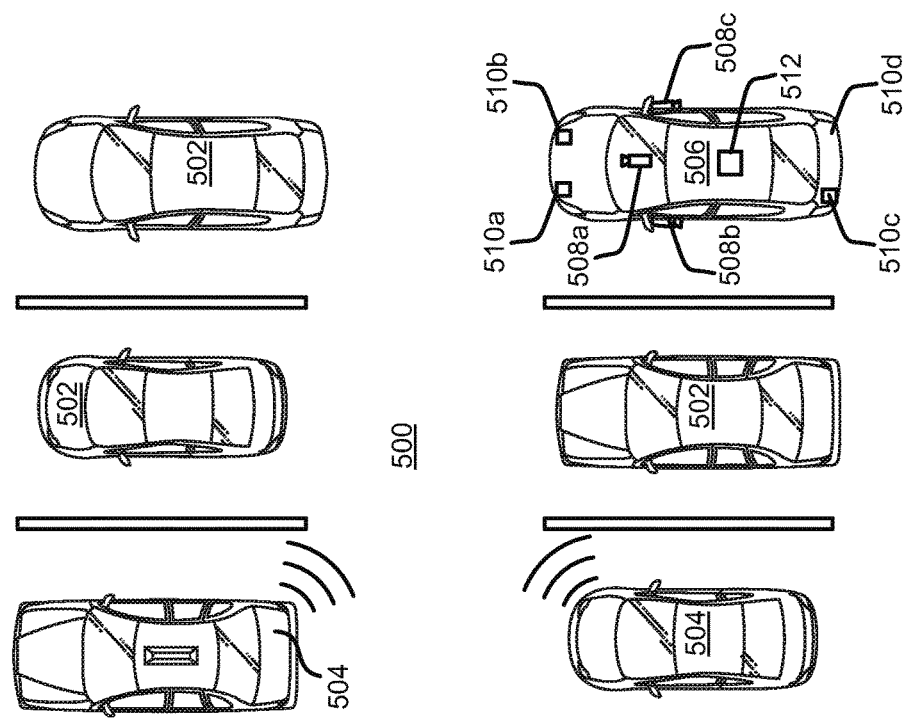
FIGS. 5A and 5B are schematic diagrams of a scenario for training the model in accordance with an embodiment of the present invention.
Figure 5B:
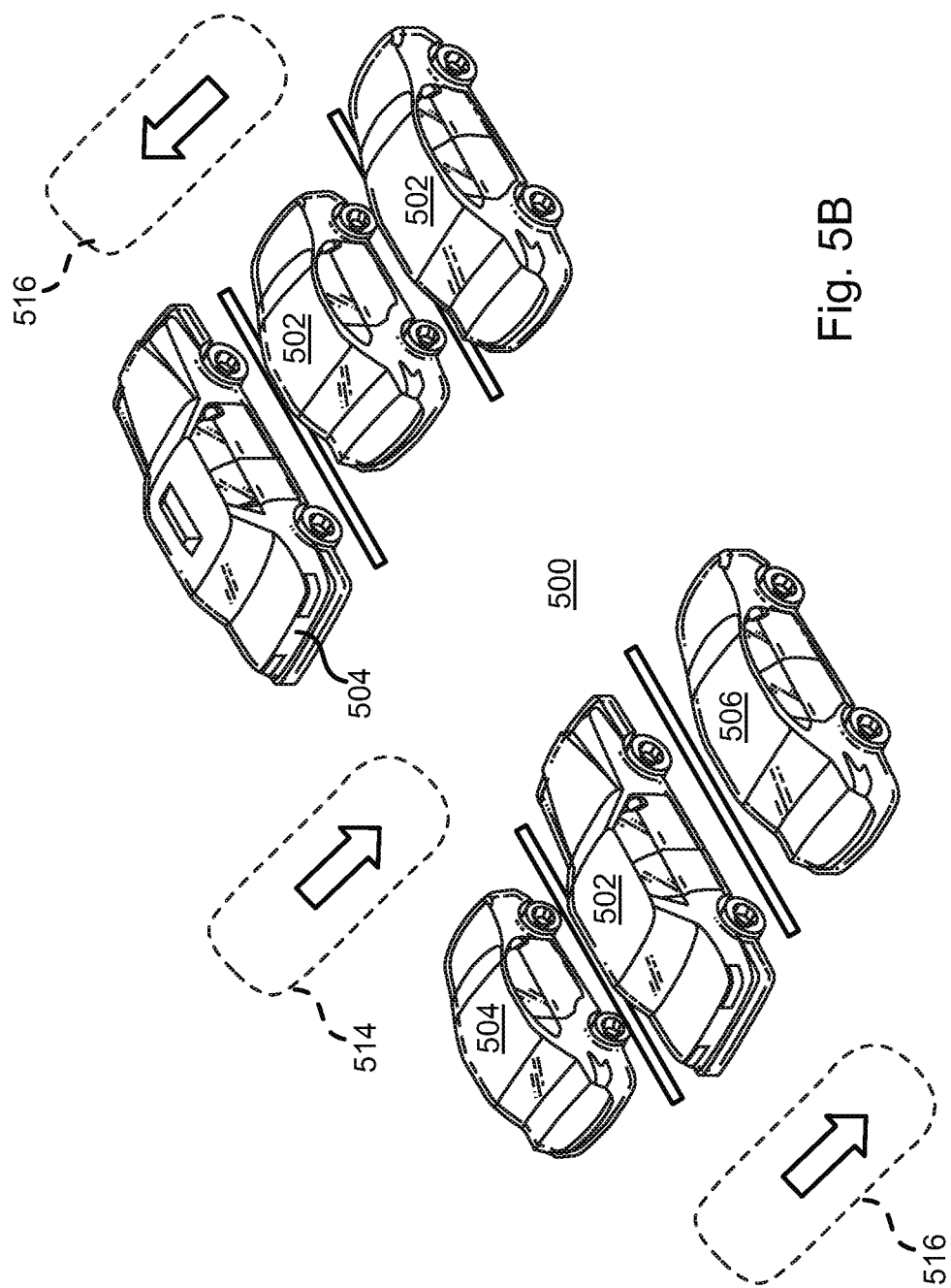

Referring to FIG. 4, the illustrated method 400 may be executed by the server system 102 in order to train the machine learning model 110. The method 400 may including defining 402 a scenario model. For example, as shown in FIGS. 5A and 5B, an environment model including a parking area 500, such as a parking lot, parking structure, side of a street, or other area where vehicles may parked. The parking area 500 may be combined with models of vehicles 502 placed within parking spots of the parking area 500. The model further includes models of vehicles 504 that have their engines running and therefore may initiate movement unexpectedly. The scenario model may further define an acceleration for the parked vehicles 504 that may be initiated during playing out of the scenario model.

A subject vehicle 506 may also be placed in the model and may have a velocity and acceleration that varies from one time step to the next. Perception of the scenario by microphones, imaging devices, and/or other sensors may be simulated from the point of view of the subject vehicle 506. In particular locations and orientations of imaging devices 508a-508c, microphones 510a, 510b, and other sensors 512 (e.g. LIDAR, RADAR, SONAR) may be defined on the subject vehicle 506 in accordance with a sensor model 108d.

In the illustrated example, the subject vehicle 506 and the vehicles 502, 504 are parked. However, the subject vehicle 506 may also be modeled as moving relative to parked vehicles 502, 504 (see dotted representation 514). Other non-parked vehicles (see dotted representations 516) may be included in the scenario with movement and acceleration of the vehicles 516 being modeled when the scenario is played out.

The method 400 may include playing out 404 the scenario model dynamics. In particular, each vehicle 502, 504, 506, 514, 516 in the model may have a pre-defined velocity or position profile that defines how the velocity and/or profile is to change over time. Accordingly, playing out 404 the scenario model dynamics may include simulating a plurality of discrete time steps wherein for each time step, each vehicle 502, 504, 506 is moved to different position within the model according to the pre-defined velocity or position profile. Playing out 404 the scenario model dynamics may further include simulating the generation and propagation of sound from various sources, e.g. the parked vehicles 504 with their engines running and any moving vehicles 514, 516 in the scenario model. Generated sound may further include simulating of road and wind noise due to movement of the vehicles 514, 516.

The method 400 may further include simulating 406 sensor perception of the scenario. For example, for each time step, the state of the model (e.g. positions and velocities of the vehicles 502, 504, 506 at that time step) may be captured from the point of view of a particular sensor. In particular, the position of the sensors according to the sensor model 108d on the subject vehicle 506 and the operational capacity of the sensors as defined in the sensor model 108d may be used to simulate a sensor output.

For example, for each imaging device, a rendering of the scenario from the point of view of the imaging device on the subject vehicle 506 may be generated. For a microphone, sound incident on the microphone during the time step as propagated from the vehicles 502, 504, 506 to the location of the microphone on the subject vehicle may be simulated. Simulating sound may include simply simulating the time of travel from a source of the sound and any Doppler effects.

Simulating sound may further include simulating reflections off of vehicles, the ground, or buildings that may arrive at the microphone location. In particular, inasmuch as the vehicles 504 may not be in a direct line of sight of any camera 508a-508c or other sensor 512, the path of sound from a vehicle 504 to the microphones 510a-510d may also not be direct. Accordingly, the simulated output of the microphones 510a-510d may include echoes and phase differences due to multiple paths from the source of sound to the microphones 510a-510d. A plurality of scenario models are preferably used such that at least a portion of the scenario models are arranged such that there is no direct path for light or sound between the source of the sound (a vehicle 504) and the microphones 501a-510d of the subject vehicle 506. In this manner, difficult real-world situations are accounted for.

For a LIDAR sensor, a point cloud from the point of view of the LIDAR sensor may be simulated, where the points of the point cloud are points of structures of the environment or vehicles 502, 504, 506, 514, 516 of the scenario that are in the field of view of the LIDAR sensor at a given time step during playing out 404 of the scenario model. In some LIDAR systems, points measured may include both a three-dimensional coordinate and a reflectivity value. In some embodiments, the models 106a, 106b may include reflectivity values for exterior surfaces thereof. Accordingly, for points of the point cloud in the point of view of the LIDAR system, the reflectivity value of the structure including each point may be included. Perception of the scenario model by various other sensors may also be included. For a RADAR or SONAR system, reflections from objects and vehicles of the scenario may be simulated for some or all time steps.

The various sensors may have different frame or scanning rates than the time step of updating the scenario model. Accordingly, more or fewer outputs may be produced then the number of times steps. For example, for sound, the number of samples required in order to accurately simulate detection of sound may be greater than the time step. Accordingly, multiple samples may be taken for each time step. For example, the time step may be subdivided into smaller time steps and simulated samples of sound propagated through the scenario model and incident on the microphone location may be recorded. In a similar manner, images from an imaging device, point clouds from LIDAR, reflections from RADAR or SONAR may be simulated at a different periods that are smaller or larger than the time step.

The result of the simulating of sensor perception at step 406 may be streams of sensor outputs, e.g. a series of images, an audio signal, a set of point clouds, a sets of reflections at different time points, etc. The streams of sensor outputs may be input 408 to a machine learning algorithm. Likewise, the classification of a vehicle as being a parked vehicle with its engine running may be input 410 to the machine learning algorithm. In some embodiments, the location of a parked vehicles 504 with its engine running is also input 410 to the machine learning algorithm as the desired output.

For example, for each time step, one or more sensor outputs for each type of sensor that were simulated for that time step may be input 408 to the machine learning algorithm. Likewise, the position of one or more vehicles 504 at that time step may be input to the model, e.g. the relative position of the vehicle 504 to the vehicle 506 in the scenario model at that time step. For audio signals, the time step may be too short for a meaningful analysis. Accordingly, samples of simulated sound may be input 408 to the model at step 408 for multiple time steps preceding and/or following the each time step, i.e. a window of time steps including the each time step.

The machine learning model 110 may be then be generated 412 by updating the model 110 for the sensor outputs input 408 for each time step and the vehicle 504 location at each time step. The manner in which the machine learning algorithm trains the model 110 may be performed according to any manner known in the art of machine learning. Likewise, the sensor outputs may be input to the machine learning algorithm in a continuous manner rather than as discrete data sets for individual time steps.

The result of the method 400 is a machine learning model 110 that is trained to output for an input stream of data at least one of (a) whether or not parked vehicle with its engine running is perceived near a vehicle, (b) a direction toward the parked vehicle with its engine running, if any, and (c) a location of the parked vehicle with its engine running. Many machine learning algorithms further output a confidence score indicating how the probability that an output of the models is correct. Accordingly, for any of (a)-(c) a corresponding confidence score may also be output by the model.

Figure 6:
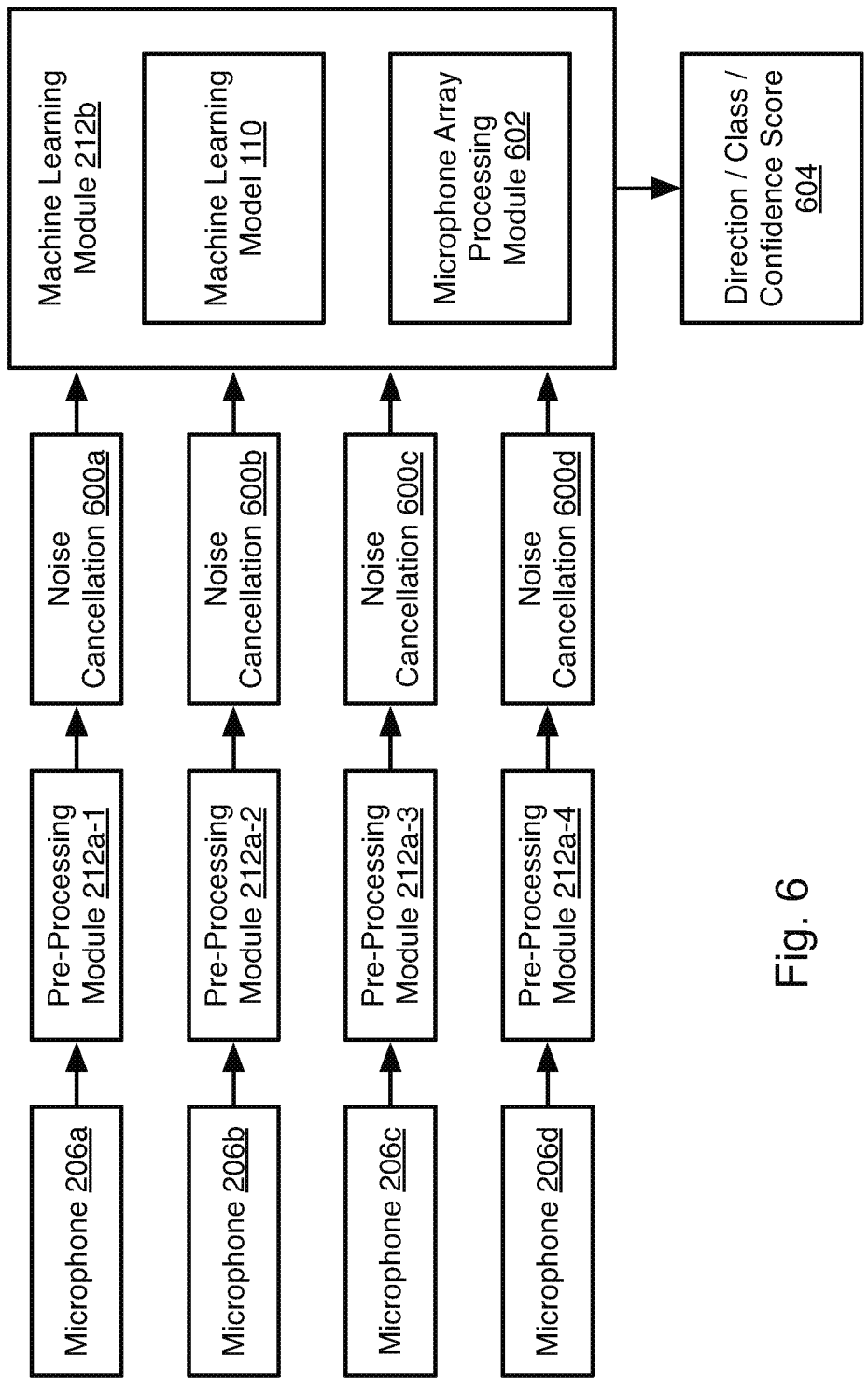
FIG. 6 is a schematic block diagram of components for performing obstacle detection using auditory data.

Referring to FIG. 6, the microphone 206 may include a plurality of microphones 206a-206d that may collectively function as a microphone array or may each be embodied as a microphone array. The output signal of each microphone 206a-206d may be input to a corresponding pre-processing module 212a-1-212a-4. The output of each pre-processing module 212a-1-212a-4 may be further processed by a noise cancellation filter 600a-600d. The output of the noise cancellation modules 600a-600d may then be input to the machine learning module 212b. In particular, the outputs of the noise cancellation modules 600a-600d may be input to a machine learning model 110 that is trained according to the method 400 described above. As noted above, the machine learning model 110 receives sensor outputs, processes them, and outputs at least one of (a) whether or not parked vehicle with its engine running is perceived near a vehicle, (b) a direction toward the parked vehicle with its engine running, if any, and (c) a location of the parked vehicle with its engine running. Many machine learning algorithms further output a confidence score indicating how the probability that an output of the models is correct. Accordingly, for any of (a)-(c) a corresponding confidence score may also be output by the model.

The pre-processing modules 212a-1-212a-4 may process the raw outputs from the microphones 206a-206d and produce processed outputs that are input to the noise cancellation modules 600a-600d or directly to the machine learning module 112b. The processed outputs may be a filtered version of the raw outputs, the processed outputs having enhanced audio features relative to the raw outputs. The enhanced audio features may be segments, frequency bands, or other components of the raw outputs that are likely to correspond to a vehicle. Accordingly, the pre-processing module 212a-1-212a-4 may include a bandpass filter that passes through a portion of the raw outputs in a frequency band corresponding to sounds generated by vehicles and vehicle engines while blocking portions of the raw outputs outside of that frequency band. The pre-processing modules 212a-1-212a-4 may be digital filters having coefficients chosen to pass signals having spectral content and/or a temporal profile corresponding to a vehicle engine or other vehicle noise, such as an adaptive filter with experimentally selected coefficients that will pass through vehicle-generated sounds while attenuating other sounds. The output of the pre-processing modules 212a-1-212a-4 may be a time domain signal or a frequency domain signal, or both. The output of the pre-processing modules 212a-1-212a-4 may include multiple signals, including signals in one or both of the time domain and frequency domain. For example, signals that are the result of filtering using different pass-band filters may be output either in the frequency or time domain.

The noise cancellation modules 600a-600d may include any noise cancellation filter known in the art or implement any noise cancellation approach known in the art. In particular, the noise cancellation modules 600a-600d may further take as inputs the speed of a vehicle incorporating the controller 202 (hereinafter the subject vehicle), a rotational speed of an engine of the subject vehicle or other information describing a status of the engine, a speed of a ventilation fan of the subject vehicle, or other information. This information may be used by the noise cancellation modules 600a-600d to remove noise caused by the engine and fan and vehicle wind noise.

The machine learning module 212b may further include a microphone array processing module 602. The microphone array processing module 602 may evaluate the timing of arrival of an audio feature from various microphones 206a-206d in order to estimate a direction to a source of the audio feature. For example, an audio feature may be the sound of a vehicle that commences at time T1, T2, T3, and T4 in the outputs of the noise cancellation modules 600a-600d. Accordingly, knowing the relative positions of the microphones 206a-206d and the speed of sound S, the difference in distance to the source from the microphones 206a-206d may be determined, e.g. $D2=S/(T2-T1)$, $D3=S/(T3-T1)$, $D4=S/(T4-T1)$, where D2, D3, D4 are the estimated difference in distance traveled by the audio feature relative to a reference microphone, which is microphone 206a in this example.

For example, the angle A to the source of a sound may be calculated as an average of $A\sin(D2/R2)$, $A\sin(D3/R3)$, and $A\sin(D4/R4)$, where R2 is the separation between the microphone 206a and microphone 206b, R3 is the separation between microphone 206c and microphone 206a, and R4 is the separation between microphone 206d and microphone 206a. This approach assumes that the source of the sound is at a large distance from the microphones 206a-206d such that the incident sound wave may be approximated as a plane wave. Other approaches for identifying the direction to a sound based on different times of arrival as known in the art may also be used. Likewise, rather than simply determining a direction, a sector or range of angles may be estimated, i.e. a range of uncertainty about any estimated direction, where the range of uncertainty a limitation on the accuracy of the direction estimation technique used.

The direction as estimated by the microphone array processing module 404 and the classification (e.g. as a parked vehicle with its engine running) and confidence score as generated by the machine learning model 110 may then be provided as an output 604 from the machine learning module 212b. In some embodiments, the machine learning model 110 is trained to both identify a parked vehicle with its engine running and the direction to it. Accordingly, in such embodiments, the microphone array processing module 404 may be omitted.

Inasmuch as there are multiple audio streams form the microphones 206a-206d, they may be processed in parallel such as using a GPU (graphics processing unit) or other parallel processing configuration. For example, the pre-processing modules 212a-1-212a-4, noise cancellation modules 600a-600d, and microphone array processing module 602 may be implemented using a GPU or other parallel processing device.

In some embodiments, the obstacle identification module 210b may add a vehicle having the classification determined by the machine learning model 110 and located at the estimated direction to a set of potential obstacles, the set of potential obstacles including any obstacles identified by other means, such as using the imaging devices 104. The collision prediction module 210c may then perform identify potential collisions with the set of potential obstacles and the decision module 210d may then determine actions to be performed to avoid the potential collisions such as turning the vehicle, applying brakes, accelerating, or the like.

Figure 7:
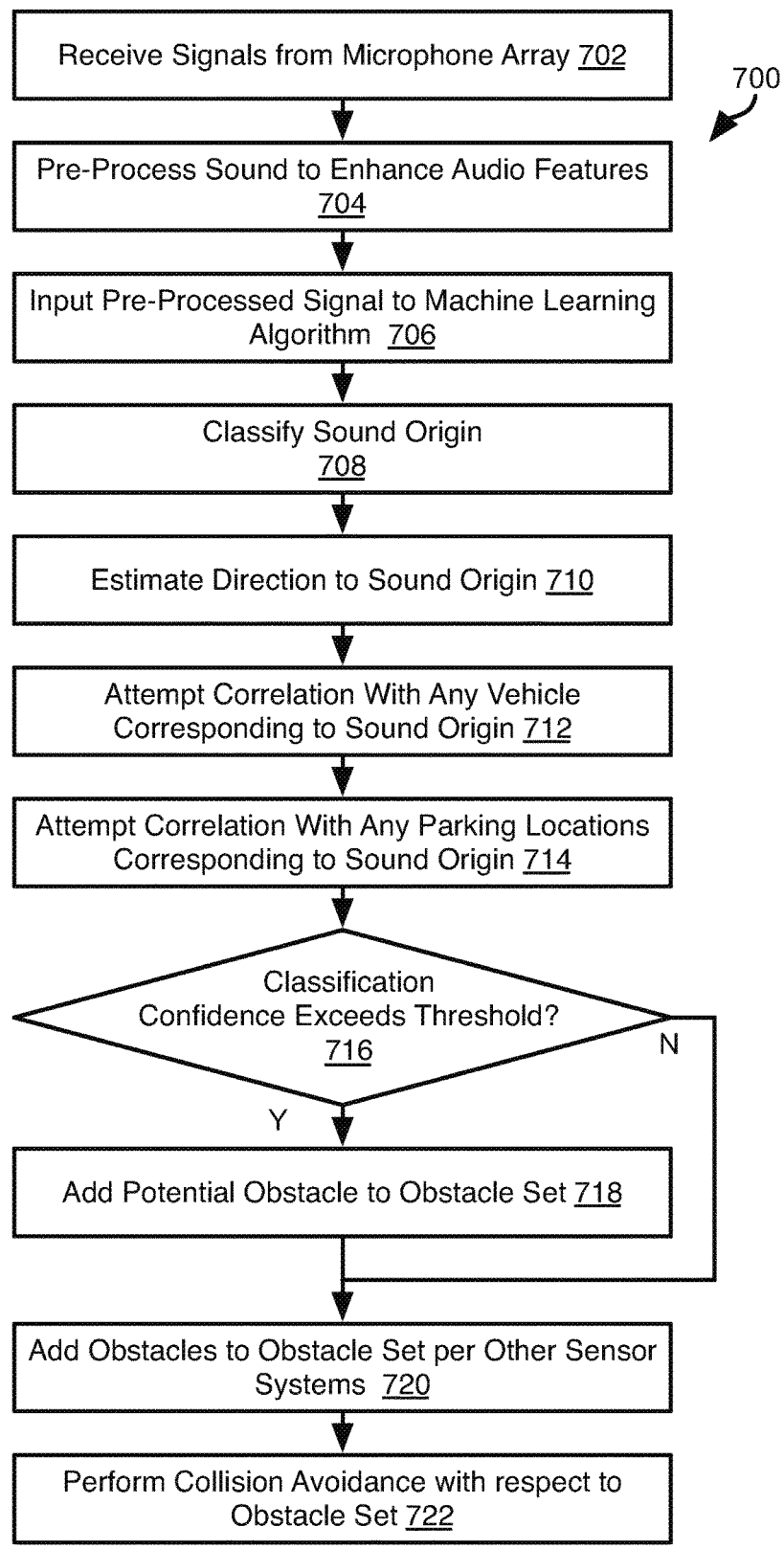
FIG. 7 is a process flow diagram of a method for performing collision avoidance based on both auditory data in accordance with an embodiment of the present invention.

FIG. 7 illustrates a method 700 that may be executed by the controller 202 by processing audio signals from the microphones 206a-206d. The method 700 may include receiving 702 audio signals representing detected sounds using the microphones 206a-206d and pre-processing 704 the audio signals to enhance audio features. This may include performing any of the filtering functions described above with respect to the pre-processing modules 212a-1-212a-4. In particular, pre-processing 704 may include generating one or more pre-processed signals in the time domain or frequency domain, each output may be a band-pass filtered version of an audio signal from one of the microphones 206a-206d or may be filtered or otherwise processed using other techniques, such as using an adaptive filter or other audio processing technique. Pre-processing 704 may further include performing noise cancellation on either the input or output of the pre-processing modules 212a-1-212a-4 as described above with respect to the noise cancellation modules 600a-600d.

The method 700 may further include inputting 706 the pre-processed signals into the machine learning model 110. The machine learning model 110 will then classify 708 the origin of the sound, i.e. the attributes of the audio features in the pre-processed signals will be processed according to the machine learning model 110, which will then output one or more classifications and confidence scores for the one or more classifications.

The method 700 may further include estimating 710 a direction to the origin of the sound. As described above, this may include invoking the functionality of the microphone array processing module 602 to evaluate differences in the time of arrival of audio features in the pre-processed outputs to determine a direction to the originator of the audio features or a range of possible angles to the originator of the audio features.

The method 700 may further include attempting to validate the classification performed at step 708 using one or more other sources of information. For example, the method 700 may include attempting to correlate 712 the direction to the sound origin with a vehicle image located within an output of an imaging sensor 204 at a position corresponding to the direction to the sound origin. For example, any vehicle image located within an angular region including the direction may be identified at step 712. If a vehicle image is found in the image stream of the imaging sensor 204 within the angular region, then a confidence value may be increased.

The method 700 may include attempting 714 to correlate the direction to the sound origin with map data. For example, if map data is found to indicate that a parking stall or other legal parking area is located near (e.g. within a threshold radius) the autonomous vehicle and within an angular region including the direction to the sound origin, then the confidence value may be increased, otherwise it is not increased based on map data. The angular region used to determine whether a parking area is within a tolerance of the direction to the sound origin may be the same or different from that used at step 712.

The confidence value may further be increased based on the confidence score from the classification step 708. In particular, the confidence score may be increased in proportion to, or as a function of, the magnitude of the confidence score. As described herein, parked cars with their engines running may be detected. Accordingly, where the classification step 708 indicates detection of the sound of a parked vehicle with its engine running, the confidence value will then be increased based on the confidence score of step 708 as well as based on steps 712 and 714.

The method 700 may include evaluating 716 whether the confidence score of step 708 exceeds a threshold. For example, where no classifications at step 708 have a confidence score above a threshold, the method 700 may include determining that the audio features that were the basis of the classification likely do not correspond to a vehicle. Otherwise, if the confidence score does exceed a threshold, then the method 700 may include adding 718 a potential obstacle to a set of obstacles identified by other means, such as using imaging devices 204. The potential obstacle may be defined as a potential obstacle located in the direction or range of angles determined at step 710.

For a classification indicating a parked vehicle with its engine running, if the confidence value based on all of steps 708, 712, and 714 exceeds a threshold corresponding to parked vehicles, then step 716 may include determining that a parked vehicle is a potential obstacle and may move from its current location. In particular, a potential path, or a range of potential paths of the parked vehicle, may be added 718 to a set of potential obstacles. For example, since the estimated direction to the parked vehicle is known, potential movement to either side of the estimated direction by the parked vehicle may be considered as a potential obstacle.

In instances where a parked vehicle is identified using imaging sensors 204 but is not determined at step 708 to have its engine running, the parked vehicle may be determined to be stationary and its potential path will not be considered for obstacle avoidance purposes.

In either outcome of step 716, obstacles are detected using other sensing systems, such as the imaging devices 204, and obstacles detected using these sensing systems are added 720 to the obstacle set. Collision avoidance is performed 722 with respect to the obstacle set. As noted above, this may include detecting potential collisions and activating one or more of a steering actuator 216a, accelerator actuator 216b, and brake actuator 216c in order to avoid the obstacles of the obstacle set as well as guiding the vehicle to an intended destination.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A method comprising:
defining, by a computer system, a three dimensional (3D) model;
simulating, by the computer system, two or more sensor outputs from sound from a parked vehicle with its engine running incident on two or more sensor locations of a subject vehicle in the 3D model; and
training, by the computer system, a machine-learning model using a location of the parked vehicle in the 3D model and the two or more sensor outputs.

2. The method of claim 1, further comprising:
defining on the subject vehicle one or more camera locations;
simulating detection of images at the one or more camera locations; and
training the machine-learning model using both the images and the two or more sensor outputs.

3. The method of claim 2 further comprising:
defining on the subject vehicle a RADAR sensor location;
simulating a RADAR sensor output according to the 3D model; and
training the machine learning model using all of the images, the RADAR sensor output, and the two or more sensor outputs.

4. The method of claim 3, further comprising:
defining on the subject vehicle a LIDAR sensor location;
simulating a sequence of point clouds detected from the LIDAR sensor location of the 3D model; and
training the machine learning model using all of the images, the RADAR sensor output, the sequence of point clouds, and the two or more sensor outputs.

5. The method of claim 1, wherein defining the 3D model further includes defining a plurality of intervening vehicles between the parked vehicle and the subject vehicle.

6. The method of claim 1, wherein the machine-learning model is a deep neural network.

7. The method of claim 1, wherein simulating the two or more sensor outputs from the sound of the plurality of vehicles incident on the two or more sensor locations comprises simulating propagation of sound from an engine of the parked vehicle, around one or more intervening vehicles between the parked vehicle, and incident on the subject vehicle.

8. The method of claim 1, wherein the parked vehicle is modeled as a vehicle emitting sounds corresponding to a running vehicle engine.

9. The method of claim 1, further comprising:
providing a vehicle including a vehicle controller and two or more microphones;
programming the vehicle controller with the machine-learning model;
receiving, by the vehicle controller, two or more audio streams from the two or more microphones;
inputting, by the vehicle controller, the two or more audio streams to the machine-learning model;
(a) determining, by the vehicle controller, that the machine-learning model indicates that the two or more audio streams currently indicate an actual parked vehicle with its engine running is present;
in response to (a), performing obstacle avoidance with respect to a potential path of the actual parked vehicle.

10. The method of claim 9, further comprising:
(b) determining, by the vehicle controller, subsequent to (a) that the machine-learning model indicates that the two or more audio streams do not indicate that an engine of a second actual parked vehicle is running;
in response to (b), refraining from performing obstacle avoidance with respect to a potential path of the second actual parked vehicle.

11. The method of claim 9, further comprising:
if the machine-learning model indicates that the two or more audio streams do not currently indicate an actual parked vehicle with its engine running is present, at least one of refrain from outputting the alert by the vehicle controller and permit, refrain from performing obstacle avoidance with respect to a potential path of the actual parked vehicle.

12. A system comprising one or more processors and one or more memory devices coupled to the one or more processors, the one or more memory devices storing executable code effective to:
define a three dimensional model including a parking area and a plurality of stationary parked vehicles, a running parked vehicle, and a subject vehicle including two or more sensor locations positioned on the parking area;
simulate two or more sensor outputs from sound from the running parked vehicle incident on the two or more sensor locations; and
train a machine-learning model using a location of the stationary parked vehicle and the two or more sensor outputs over time.

13. The system of claim 12, wherein the executable code is further effective to cause the one or more processors to:
define on the subject vehicle one or more camera locations;
simulate detection of images at the one or more camera locations; and
train the machine-learning model using both the images and the two or more sensor outputs.

14. The system of claim 13, wherein the executable code is further effective to cause the one or more processors to:
define on the subject vehicle a RADAR sensor location;
simulate a RADAR sensor output according to the 3D model; and
train the machine learning model using all of the images, the RADAR sensor output, and the two or more sensor outputs.

15. The system of claim 14, wherein the executable code is further effective to cause the one or more processors to:
define on the subject vehicle a LIDAR sensor location;
simulate a sequence of point clouds detected from the LIDAR sensor location of the 3D model; and
train the machine learning model using all of the images, the RADAR sensor output, the sequence of point clouds, and the two or more sensor outputs.

16. The system of claim 12, wherein the executable code is further effective to cause the one or more processors to define the 3D model defining a plurality of intervening vehicles between the parked vehicle and the subject vehicle.

17. The system of claim 12, wherein the machine-learning model is a deep neural network.

18. The system of claim 12, wherein the executable code is further effective to cause the one or more processors to simulate the two or more sensor outputs from the sound of the plurality of vehicles incident on the two or more sensor locations by simulating Doppler effects and propagation distances of the sound.

19. The system of claim 12, wherein the executable code is further effective to cause the one or more processors to model the parked vehicle as a vehicle emitting sounds corresponding to a running vehicle engine.

20. The system of claim 12, further comprising a vehicle including a vehicle controller and two or more microphones;
   wherein the vehicle controller is programmed with the machine-learning model;
   wherein the vehicle controller is further programmed to:
      receive two or more audio streams from the two or more microphones;
      input the two or more audio streams to the machine-learning model;
      if the machine-learning model indicates that the two or more audio streams currently indicate an actual parked vehicle with its engine running, performing obstacle avoidance with respect to a potential path of the actual parked vehicle.

* * * * *